United States Patent [19]
Igarashi et al.

[11] Patent Number: 5,224,057
[45] Date of Patent: Jun. 29, 1993

[54] ARRANGEMENT METHOD FOR LOGIC CELLS IN SEMICONDUCTOR IC DEVICE

[75] Inventors: Mutsunori Igarashi; Kaori Kora, both of Yokohama, Japan

[73] Assignee: Kabushiki Kaisha Toshiba, Kawasaki, Japan

[21] Appl. No.: 959,468

[22] Filed: Oct. 9, 1992

Related U.S. Application Data

[63] Continuation of Ser. No. 486,351, Feb. 28, 1990, abandoned.

[30] Foreign Application Priority Data

Feb. 28, 1989 [JP] Japan .................................. 1-47252
Feb. 28, 1989 [JP] Japan .................................. 1-47253

[51] Int. Cl.$^5$ ............................................. G06F 15/60
[52] U.S. Cl. .................................... 364/490; 364/489; 364/488
[58] Field of Search ................ 364/491, 490, 489, 488

[56] References Cited

U.S. PATENT DOCUMENTS

| | | | |
|---|---|---|---|
| 4,554,625 | 11/1985 | Otten | 364/491 |
| 4,577,276 | 3/1986 | Dunlop et al. | 364/491 |
| 4,593,363 | 6/1986 | Burstein et al. | 364/491 |
| 4,752,887 | 6/1988 | Kuwahara | 364/491 |
| 4,775,942 | 10/1988 | Ferreri et al. | 364/491 |
| 4,839,821 | 6/1989 | Murakata | 364/491 |
| 4,855,929 | 8/1989 | Nakajima | 364/490 |
| 4,964,057 | 10/1990 | Yabe | 364/491 |

OTHER PUBLICATIONS

Maurice Hanan et al., Placement Techniques, pp. 213-282, IBM Thomas J. Watson Research Center, Yorktown Heights, N.Y.

Maurice Hanan et al., Some Experimental Results on Placement Techniques, pp. 214-224, IBM Thomas J. Watson Research Center Yorktown Heights, N.Y.

Melvin A. Breuer, Min-Cut Placement, Design Automation and Fault-Tolerant Computing, pp. 343-362, vol. 1, No. 4, Oct. 1977.

Loretta I. Corrigan, A Placement Capability Based on Partitioning, Design Automation Conf., 1979, pp. 406-413, Culver City, Calif. 90230.

Klaus Klein et al., A Study on Bipolar VLSI Gate-Arrays Assuming Four Layers of Metal, 1982 IEEE, pp. 472-480.

Shiraishi et al., Efficient Placement and Routing Techniques for Master Slice LSI, pp. 458-464.

*Primary Examiner*—Vincent N. Trans
*Attorney, Agent, or Firm*—Oblon, Spivak, McClelland, Maier & Neustadt

[57] ABSTRACT

An arrangement method for logic cells in a semiconductor IC device, in which a plurality of logic cells are arranged on a semiconductor chip and wiring is performed between the logic cells so as to realize a desired circuit, comprises the steps of developing the logic cell informations to be arranged on the chip and already-arranged cell and wiring informations into connection pins and inhibited areas for wiring, converting the inhibited areas for wiring into equivalent pins so as to treat the inhibited areas for wiring equivalently with respect to the connection pins, and imaginarily dividing the chip into lattices and subsequently uniforming a ratio of a sum of the numbers of the connection pins and the equivalent pins to a region capable of arrangement in each lattice, whereby a position of each logic cell is determined.

4 Claims, 14 Drawing Sheets

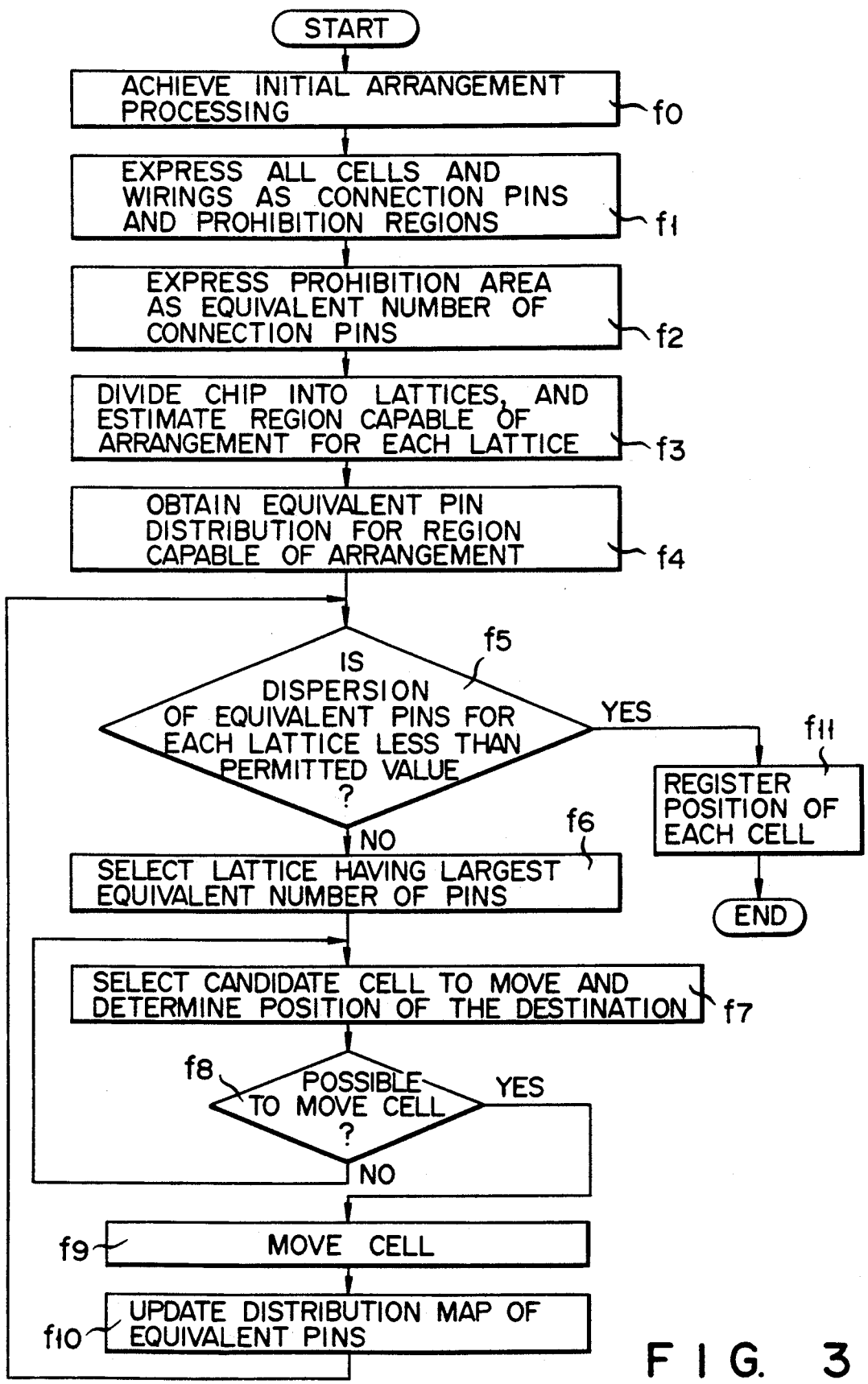
F I G. 3

F I G. 4A
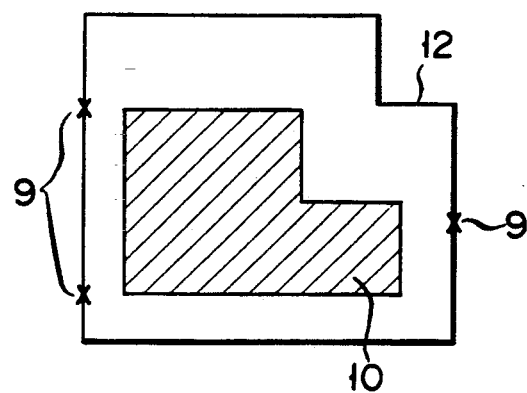
F I G. 4B
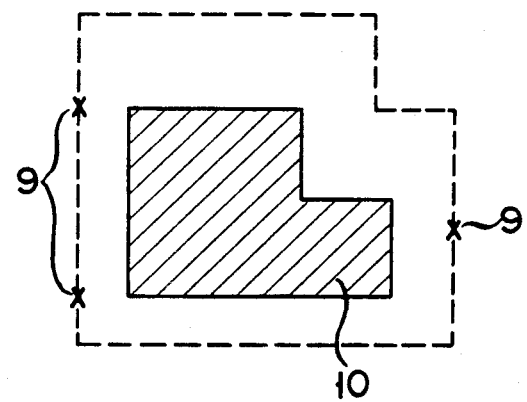
F I G. 4C
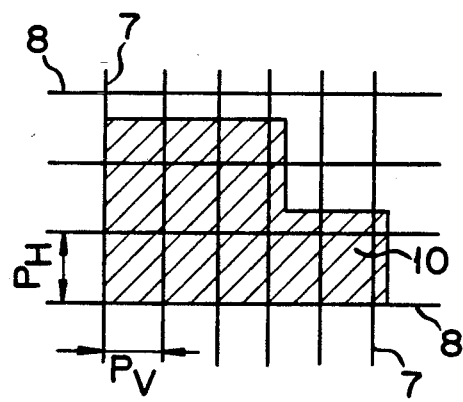

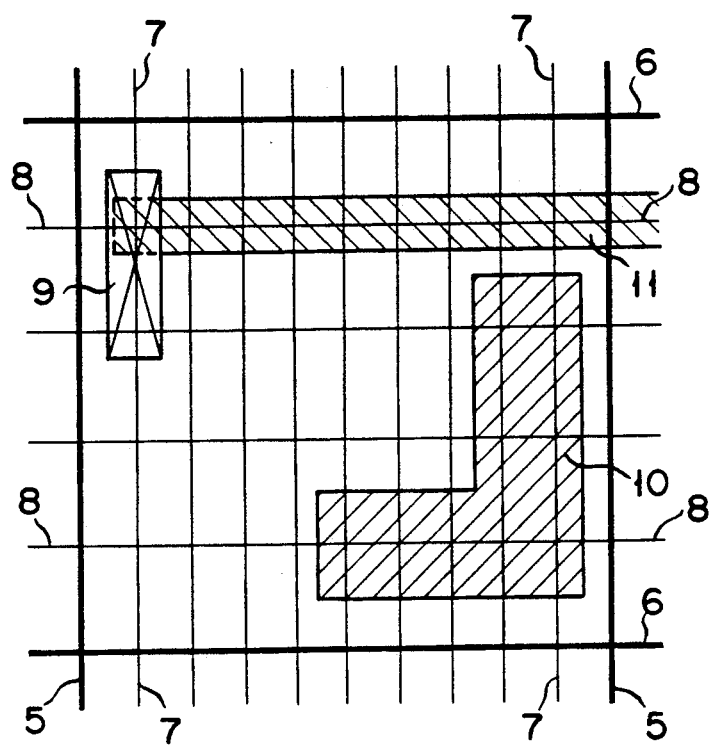
F I G. 5
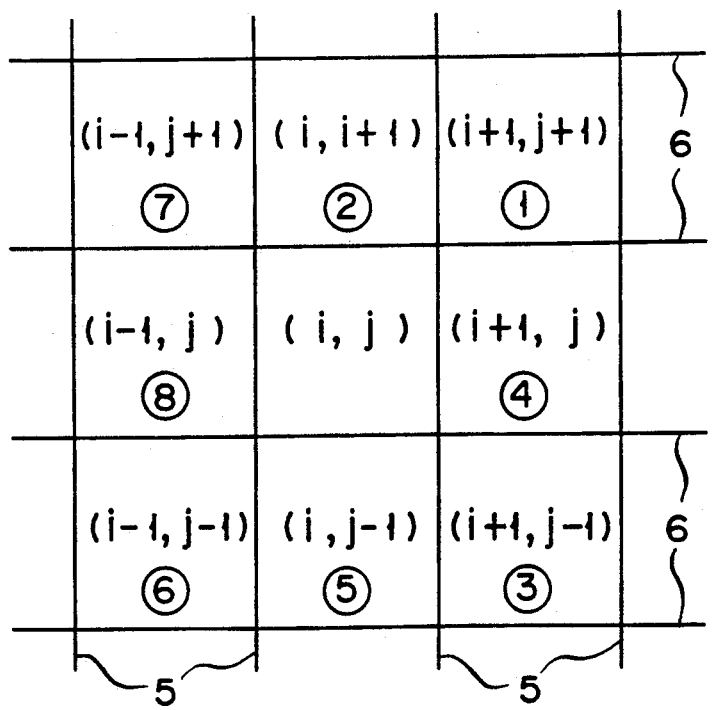
F I G. 6

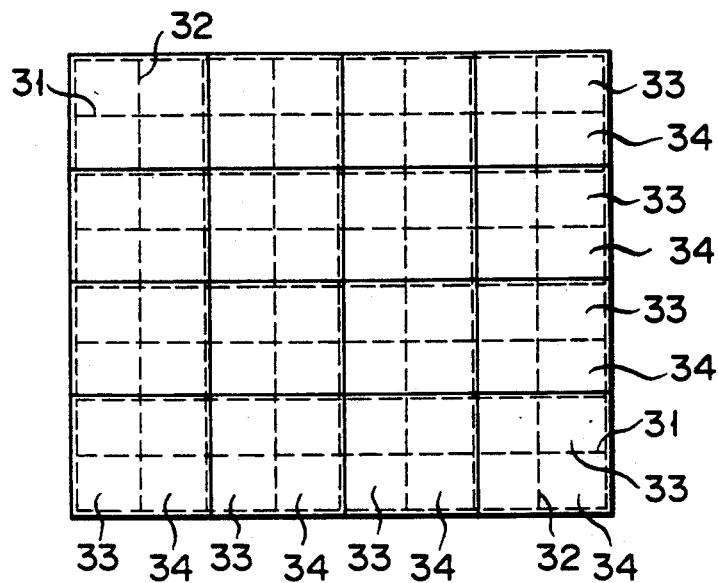
F I G. 8
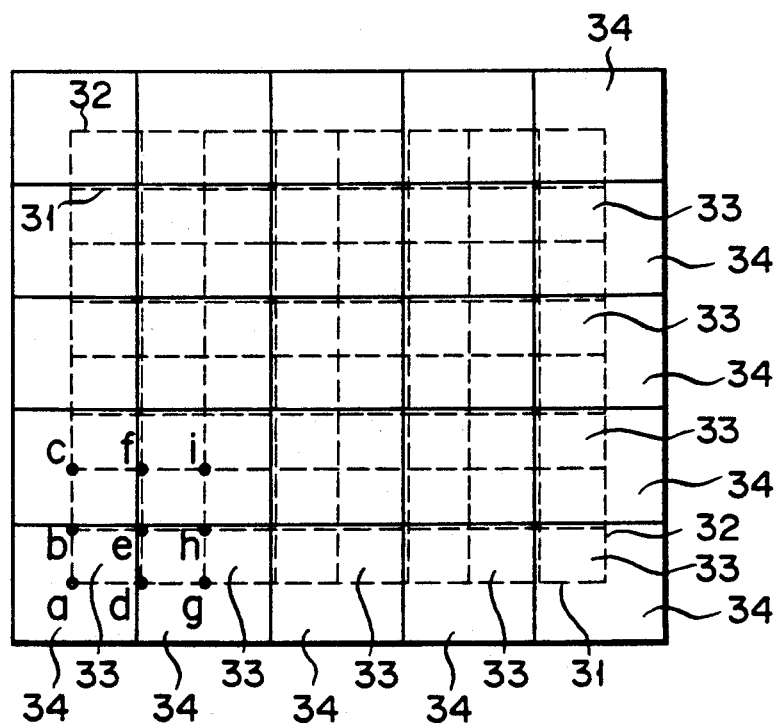
F I G. 9

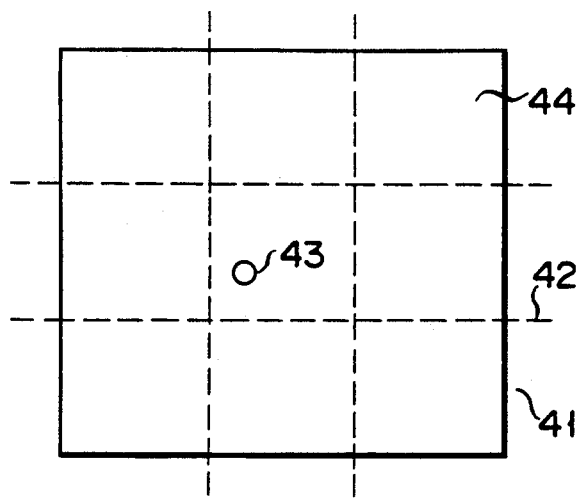
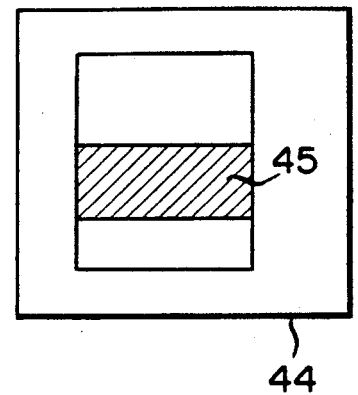
F I G. 13A        F I G. 13B
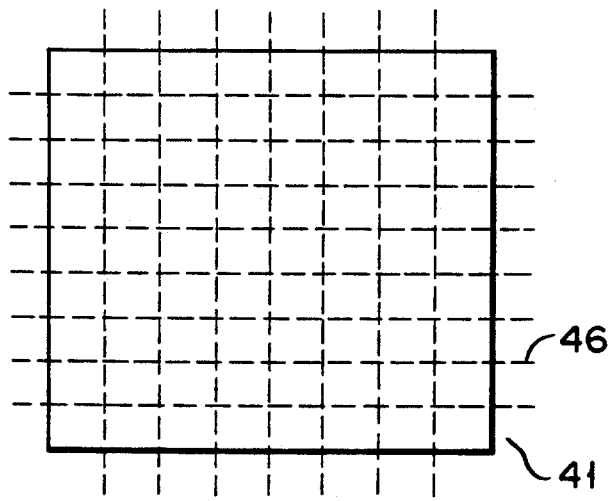
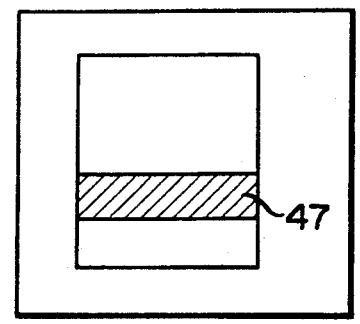
F I G. 14A        F I G. 14B

ARRANGEMENT METHOD FOR LOGIC CELLS IN SEMICONDUCTOR IC DEVICE

This application is a continuation of application Ser. No. 07/486,351, filed on Feb. 28, 1990, now abandoned.

BACKGROUND OF THE INVENTION

1. Field of the Invention

The present invention relates to a method of arranging and integrating a large number of logic cells in a semiconductor chip by using a computer.

2. Description of the Related Art

A gate array method (also called a master slice method) is known as a method of designing a semiconductor IC device. In this method, basic cells and input/output (I/O) cells each consisting of a predetermined number of transistors are regularly arranged on a master chip. Wiring between these gates (the basic cells and the I/O cells) is then performed in accordance with the specifications required by a user so as to design an LSI having a desired function.

A wafer on which only basic cells are arranged prior to a wiring step is generally called a master wafer. The process of performing wiring of a master wafer and allowing it to have a specific function as an LSI is called "personalizing".

In a gate array, inverters, NAND gates, flip-flops, and the like as cells can be freely realized by using a plurality of basic cells and performing wiring. All the wiring patterns (to be referred to as macrocells hereinafter) used as standard patterns are prepared in large quantities as a library. Efficient design can be performed by using this library.

FIG. 1 shows a master wafer chip as an example. Basic cells 3 are arranged within a chip 1 in the longitudinal and transverse directions without any gap. An I/O cell arrangement region 4 is formed along the periphery of the chip 1. I/O cells are arranged on the region 4. A user arranges a required number of macrocells of required types on array regions 2 of basic cells in accordance with the number of LSIs to be realized. Personalizing is then performed by wiring the terminals of the cells on the basis of circuit connection data.

Arrangement/wiring processing for a high-integration, large-scale gate array is difficult to perform by means of manual design. For this reason, automatic arrangement/wiring processing using a computer is normally performed. Automatic arrangement processing for determining the position of each macrocell on a chip is roughly divided into two steps: the step of determining the initial position of each logic cell (the initial arrangement step); and the step of improving a given initial arrangement result (the arrangement improving step). As to the arrangement improving step, several methods have been proposed. One of the following three factors is generally used as an objective function of the algorithm of such a method:

(a) the minimum ratio of wiring lengths;
(b) the minimum ratio of the number of wirings through via holes; and
(c) a uniform wiring density level.

As a method using the factor (a), an FDR method is available (reference: Hanan, M., Wolff, P.K. and Anguli, B.J., "Some Experimental Results on Placement Techniques", Proc. 13th Design Automation Conference, pp. 214–224, 1976).

In the FDR method, the connecting relationship between cells is expressed as a tension between the cells. The overall wiring length is minimized by interchanging cells or moving cells so as to reduce this tension.

As a method using the factor (b), a MIN-CUT method is available (reference: M.A. Breuer, "MIN-CUT Placement", Proc. Journal of Design Automation and Fault-Tolerant Computing, October, pp. 343–362, 1977).

In the MIN-CUT method, the interchange of cells is performed to decrease the number of signal lines (to be referred to as a cut number hereinafter) extending across imaginary cutlines of a chip region, thus minimizing the total cut number.

In either of the methods using the factors (a) and (b), wiring requests tend to locally concentrate on a chip, resulting in an inadequate arrangement of a gate array. This makes wiring difficult.

In automatic arrangement/wiring processing for a gate array, it is strongly required to wire all the cells without wiring errors and short-circuiting. Methods using the factor (c) aim at a wiring rate of 100%. For example, a MAX-CUT MIN method is available (reference: H. Shiraishi, F. Hirose, "Efficient Placement and Routing Techniques for Master Slice LSI", Proc. 17th Design Automation Conference, pp. 458–464, 1980).

In the MAX-CUT MIN method, the cut number of a cutline having the maximum cut number is decreased. In this method, although the wiring request of each cutline can be restricted to a value less than a permitted value, wiring of a finer pattern is difficult to achieve. For this reason, the wiring rate could not be sufficiently increased. In the above-described method, since a specific wiring model (to be referred to as a net model hereinafter) is used to estimate an imaginary wiring route, the wiring result is greatly changed depending on a net model to be used. The selection of such a net model greatly influences the performance of automatic arrangement and hence is important. However, with an increase in accuracy of a net model, the processing time is increased and the processing becomes complicated.

As a method of solving these problems, a method of distributing connecting pins on a chip at a uniform density level is available (reference: U. Schulz, Rainer Zuhlke, "A Study on Bipolar VLSI Gate-Arrays Assuming Four Layers of Metal", Proc. IEEE JOURNAL OF SOLID-STATE CIRCUITS, VOL. SC-17, No. 3, pp. 427–480, 1982). Since a strong correlation is present between a wiring distribution and a connection pin distribution, a uniform distribution of wiring requests on a chip is substantially equivalent to a uniform distribution of connection pins. However, wiring cannot be satisfactorily facilitated by simply performing uniform distribution of the connection pins. This is because factors which weaken the correlation between a wiring distribution and a connection pin distribution are present. For example, actual cells include portions which cannot be used for wiring (to be referred to as inhibited areas for wiring hereinafter) and cells vary in size. FIGS. 2A and 2B show states wherein the same number of connection pins (connection pins 9) are respectively included in lattices having the same area (defined by vertical and horizontal lattice sides 5 and 6). Reference numeral 10 denotes an inhibited area for wiring; and 12, a cell. In comparison with FIG. 2A, it is apparent from the sizes of wiring regions that the wiring in FIG. 2B can be more easily performed under the same wiring conditions. As described above, even with the same distribution of connection pins, the difficulty of wiring may vary. For these reasons, in the above-described method, wiring could not be satisfactorily facilitated. In the above-described method, therefore, the connection pins 9 and the prohibition regions are difficult to process independently in order to facilitate wiring.

As described above, in the method of minimizing the wiring length or the number of wirings through via holes, complicated processing is required, and local concentration of wirings is caused to interfere with an increase in wiring rate. In the method of uniforming the distribution of wirings, the processing time is increased and the processing becomes complicated. Furthermore, in the method of uniforming the distribution of connection pins on a chip, the effect of decreasing the wiring density level is insufficient.

As another method of improving an arrangement, a pairwise interchange method and a neighborhood interchange method are available. These methods are disclosed in M. Haman and J.M. Kurtzberg, "Placement Techniques", Chaps. 5 in Design Automation of Digital Systems: Theory and Techniques, Vol. 1 (ed. M.A. Breuer) Prentice Hall N.J. 1972, pp. 213–282. In either of the methods, logic cells are interchanged with each other in a layout region by a given method so as to satisfy each objective function.

The problem of such a method is that it takes a long period of time to obtain a global optimal solution. In order to solve the problem of a long processing time, hierarchical processing may be considered. In this hierarchical processing, the size of a layout region to be processed at once is limited to a given value. In this processing, however, a problem is still left unsolved when a global optimal solution is to be obtained as the final object of arrangement improving processing. In this processing, in order to increase the processing time, orthogonal imaginary lines are set in layout regions (regions divided by these imaginary lines will be called lattices hereinafter). However, the initially-set lattice size greatly influences an arrangement result.

In addition, whether to move or interchange logic cells between lattices is determined under the limitation that overlapping of cells within a lattice is not allowed. This limitation greatly interferes with an improvement in arrangement. This is a factor which largely reduces the degree of freedom of improvement in a gate array in which positions allowing arrangement of logic cells are limited.

SUMMARY OF THE INVENTION

It is an object of the present invention to provide an arrangement method for logic cells in a semiconductor IC device, which is designed to efficiently decrease locally high wiring density levels and to increase the wiring rate.

It is another object of the present invention to provide a layout method of a semiconductor IC device, which can increase the degree of freedom of movement and interchange of logic cells, shorten the processing time for an improvement in arrangement, and reduce the frequency of generation of local solutions.

According to the present invention, the cell boundaries of all the cells to be arranged on a chip are removed, and the cells are developed into inhibited areas for wiring and connection pins. In addition, a portion, such as a portion on which wirings are formed, which cannot be used as a wiring region is treated as an inhibited area for wiring. In consideration of the fact that both the inhibited areas for wiring and the connection pins occupy some regions, they can be equivalently treated. In this case, each inhibited area for wiring is expressed as the number of equivalent connection pins corresponding to the area of the inhibited area for wiring, and is treated equivalently with respect to the connection pins. However, in consideration of the occupation area of wirings to be connected, the occupation area of connection pins cannot be treated to be totally equivalent to an inhibited area for wiring whose area is determined regardless of wiring processing. For this reason, when the area of an inhibited area for wiring is to be expressed as equivalent connection pins, weighting is performed.

The chip is then divided into lattices. In each lattice, the ratio of the sum of the numbers of the connection pins and the equivalent pins to a region capable of arrangement is uniformed. As a result, a uniform wiring density level is obtained at each portion on the chip.

In addition, according to the present invention, box regions (to be referred to as pin boxes) each consisting of a plurality of lattices are set on a chip which is divided into lattices. In each lattice of a specific pin box, the distribution of the ratios of the sums of connection pins and inhibited areas for wiring to regions capable of arrangement is equalized. After the distribution in the predetermined pin box is uniformed and converges, another pin box is selected, and the above-described processing is repeated for the selected pin box. Uniforming processing of the distribution of the ratios in another pin box is performed until the distribution of the ratios of the sums of the connection pins and the inhibited areas for wiring to the corresponding regions capable of arrangement is uniformed in the entire chip.

According to the present invention, there is provided an arrangement method for logic cells in a semiconductor IC device, in which a plurality of logic cells are arranged on a semiconductor chip and wiring is performed between the logic cells so as to realize a desired circuit, comprising the steps of:

developing the logic cells to be arranged on the chip and already-arranged cells and wirings into connection pins and inhibited areas for wiring;

converting the inhibited areas for wiring into equivalent pins so as to treat the inhibited areas for wiring equivalently with respect to the connection pins; and dividing the chip into lattices and uniforming a ratio of a sum of the numbers of the connection pins and the equivalent pins to a region capable of arrangement for each lattice, whereby a position of each logic cell is determined.

In addition, in the arrangement method for logic cells in a semiconductor IC according to the present invention, after cells to be arranged on a chip and already-arranged cells and wirings are developed into connection pins and inhibited areas for wiring, conversion processing is performed to equivalently treat the inhibited areas for wiring and the connection pins, and the inhibited areas for wiring are replaced with equivalent pins. The chip is then divided into lattices, and a plurality of box regions each including a predetermined number of lattices are designated. In each box region, the ratio of the sum of the connection pins and the equivalent pins to a corresponding region capable of arrangement of each lattice is uniformed.

According to the present invention, the sums of the areas of connection pins and inhibited areas for wiring with respect to regions capable of arrangement are uniformly distributed on a chip. Therefore, an increase in local wiring density level can be prevented, and the wiring ratio can be increased.

In addition, since estimation of an imaginary wiring route using a net model need not be performed, arrangement of gates can be performed independently of the characteristics of a circuit whose layout is to be designed. Since the distribution of wirings is not directly operated, the processing can be simplified, and high-speed processing can be performed.

Moreover, in the present invention, since the distribution of sums of connection pins and inhibited areas for wiring is uniformed within a limited range (in a box region), a locally high wiring density level can be reduced. Since the amount of data to be processed at once can be restricted to the number of lattices in a given box region, the processing speed can be further increased.

According to another characteristic feature of the present invention, a lattice size as a unit of a region for which logic cells are moved and interchanged with each other, and a permitted overlapping condition of cells are changed stepwise.

That is, according to the present invention, in an automatic layout method for a semiconductor IC, after an initial arrangement of logic cells is provided, a layout region is divided into a plurality of regions. When logic cells are moved or interchanged with each other between the regions so as to improve the arrangement, the size of each divided region is changed with the progress of the above-described arrangement improving processing.

Furthermore, in the present invention, in addition to the above changes in size of each divided region, the permitted overlapping rate of logic cells is changed.

According to the present invention, by changing the lattice size with the progress of arrangement improving processing, the processing can be performed at high speed, and an arrangement result is not greatly influenced by the initial lattice size. Therefore, a global optimal solution can be obtained. That is, a local solution in arrangement improving processing can be removed, and the processing time can be shortened. In addition, a certain degree of freedom is provided to overlapping of cells in a lattice, and the degree of freedom is changed with the progress of processing so that an arrangement condition corresponding to an actual state can be finally set. Therefore, the effect of arrangement improving processing by the movement or interchange of logic cells can be increased, thus more effectively achieving the prevention of the local solution and shortening of the processing time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrates presently preferred embodiments of the invention and, together with the general description given above and the detailed description of the preferred embodiments given below, serve to explain the principles of the invention.

FIG. 3 is a flow chart showing overall processing of an arrangement method according to the first embodiment of the present invention;

FIGS. 4A, 4B, and 4C are views for explaining a method of converting an prohibition area into the number of equivalent pins;

FIG. 5 is a view for explaining conversion of an inhibited area for wiring into equivalent pins;

FIG. 6 is a view for explaining the destinations of cells;

FIG. 8 is a view showing a case wherein pin boxes are set on a chip according to the second embodiment;

FIG. 9 is a view showing a case wherein the setting of the pin boxes is changed (moved) according to the present invention;

FIG. 13A is a view for explaining lattices in the initial step of arrangement improving processing according to the fourth embodiment of the present invention;

FIG. 13B is a view for explaining a permitted overlapping rate of cells in a lattice in the initial step of the arrangement improving processing according to the fourth embodiment FIG. 14A is a view for explaining lattices in a latter step of the arrangement improving processing according to the fourth embodiment;

FIG. 14B is a view for explaining a permitted overlapping rate of cells in a lattice in the latter step of the arrangement improving processing according to the fourth embodiment;

DETAILED DESCRIPTION OF THE PREFERRED EMBODIMENTS

Figure 1:
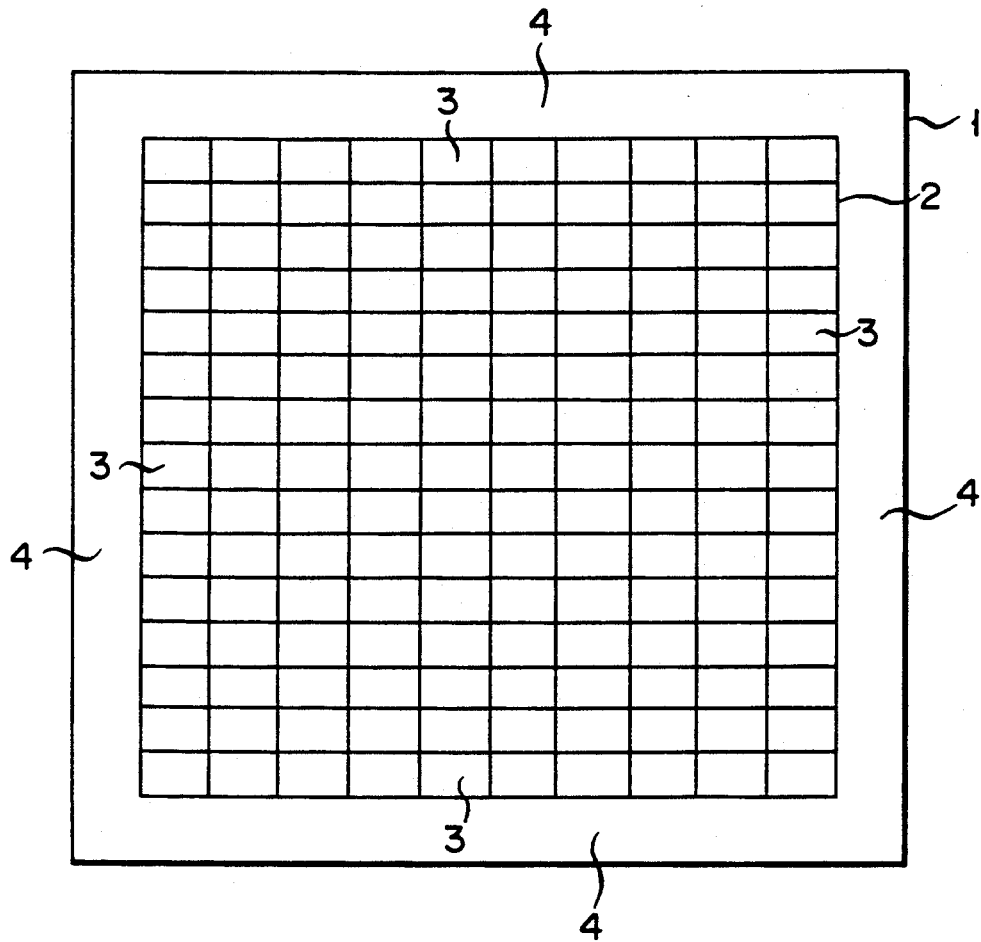
FIG. 1 is a schematic view of a chip of a gate array system.
Figure 2A:
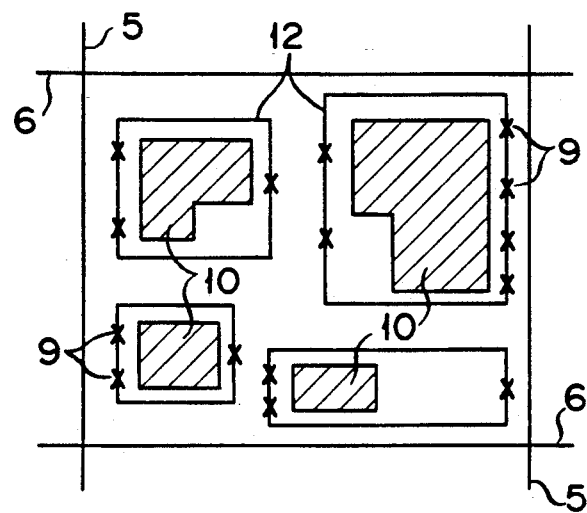
FIGS. 2A and 2B are views showing a conventional method of uniforming only the distribution of connection pins on chip.
Figure 2B:
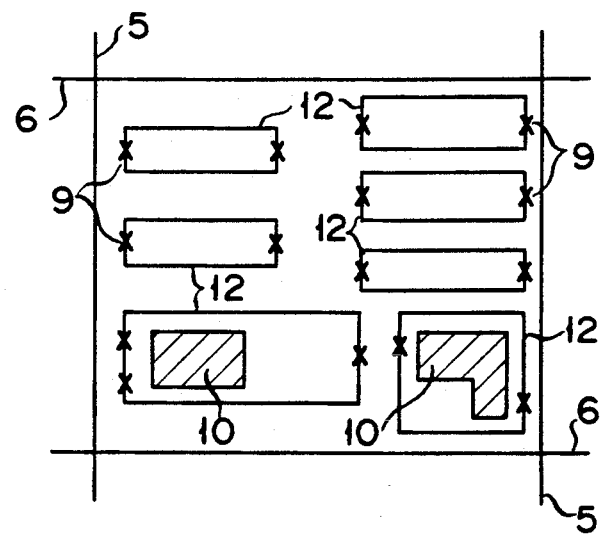

An arrangement method for logic cells in a semiconductor IC device according to the first embodiment of the present invention will be described below with reference to FIG. 3. After the arrangement procedure is started, initial arrangement processing is performed in the same manner as in the conventional method. All the cells to be used in this initial arrangement processing are placed on a chip (step f0). Subsequently, arrangement improving processing as a characteristic feature of the present invention is performed on the basis of the initial arrangement processing.

All the cells placed on the chip are developed into connection pins of the cells and inhibited areas for wiring. Similarly, portions which cannot be used for wiring, e.g., wirings on the chip are expressed as inhibited areas for wiring (step f1). These inhibited areas for wiring which cannot be used as wiring regions are respectively expressed as the numbers of imaginary connection pins corresponding to the areas of the inhibited areas for wiring (step f2). A method of converting these inhibited areas for wiring into imaginary connection pins (equivalent pins) will be described later. By introducing equivalent pins in the arrangement method, connection pins and inhibited areas for wiring as factors influencing a wiring density level can be simultaneously treated. The chip is then imaginarily divided into lattices, and a region capable of arrangement is evaluated for each lattice while the sum of the numbers of connection pins and equivalent pins included in each lattice (to be simply referred to as the number of equivalent pins hereinafter) is obtained (step f3). With this operation, an equivalent pin distribution in a region capable of arrangement for each lattice can be obtained (step f4). The arrangement state of the cells on the chip can be evaluated in detail on the basis of this distribution map of the equivalent pins. If the dispersion of the equivalent pins for each lattice is less than a predetermined permitted value, the arrangement improving processing is completed, and the position and the like of each cell are registered (steps f5 and f11). If the dispersion of the equivalent pins for each lattice is larger than the predetermined permitted value, the following arrangement improving processing is performed.

An arbitrary cell is randomly selected from a lattice having the largest number of equivalent pins and is moved into its adjacent lattice. If the selected cell cannot be moved for some reason, an arbitrary cell is randomly selected from the remaining cells so as to be moved (steps f6 to f9). The manner of determining the destination of each cell will be described later. If a cell is moved, the number of equivalent pins in the corresponding lattice is decreased, and the wiring density level in the cell is lowered. If a cell is moved, the distribution maps of the equivalent pins in the lattices associated with the movement of the cell are updated (step f10). This update operation is performed to cause the distribution maps of the equivalent pins which are changed upon the movement of the cell to be reflected in the subsequent cycle. The processing from step f6 to step f10 is repeated until the end determination condition in step f5 is satisfied. With this series of operations, the equivalent pin distributions of the respective lattices can be uniformed.

Conversion of an ihibited area for wiring into imaginary pins is performed in the manner shown in FIGS. 4A, 4B, and 4C. More specifically, the area of an inhibited area for wiring 10 is evaluated in terms of the number of wiring grids which is determined by vertical and horizontal wiring lattices 7 and 8. The evaluated area is regarded as the number of equivalent pins. Referring to FIG. 4C, reference symbols PH and PV denote wiring pitches in the respective wiring directions. In this case, the equivalent pin distribution of a region capable of arrangement for each lattice is calculated by the following equation:

$$EP_{ij} = \Sigma_{LAY}\{(K \cdot G_{obs} + G_{pin})/G_{PLACE}\}_{LAY}$$

EPij: the number of equivalent pins in a region capable of arrangement
$G_{PLACE}$: the area of a region capable of arrangement
$G_{obs}$: the area of an inhibited areas for wiring (the number of equivalent pins)
$G_{pin}$: the number of pins
K: a constant (0<K<1)
suffix ij: a lattice number
suffix$_{LAY}$: a wiring layer In this case, the constant K is a coefficient which is used to treat the inhibited area for wiring 10 equivalently with respect to connection pins 9. In general, the occupation area of the connection pins 9 is smaller than that of the inhibited area for wiring 10. However, the occupation area of the connection pins connected to wirings becomes equal to or larger than that of the inhibited area for wiring 10.

FIG. 5 shows a case wherein the number of wiring grids occupied by a connection pin 9 is two, and the number of wiring grids occupied by an hibited area for wiring 10 is nine. If, however, a wiring 11 is formed as in FIG. 5, the area occupied by the connection pin 9 and the wiring 11 connected thereto within the lattice corresponds to ten as the number of wiring grids.

The destination of a cell 12 is selected from adjacent eight lattices, as shown in FIG. 6. A lattice having the most sparse distribution is retrieved from these eight lattices on the basis of the distribution map of the equivalent pins formed in step f4 in FIG. 3, and the retrieved lattice is set to be the first candidate of the destination. Subsequently, the adjacent lattices are ranked in the order in which the distributions become denser. In practice, however, only the first to third or fourth candidates need be determined as destination candidates. The movement of the cell is tried first with respect to a lattice determined as the first destination candidate. If this movement is impossible, the remaining lattices of lower ranks are sequentially tried.

In FIG. 6, a lattice (i,j) has the maximum value of the distribution map of the equivalent pins, and other eight lattices (i−1,j−1) to (i+1,j+1) are its adjacent lattices. Numbers in the adjacent lattices represent the ranks of destination candidates. The movement of a cell selected from the lattice (i,j) is tried first with respect to the lattice (i+1,j+1). If this movement is allowed, the flow advances to the next step. Otherwise, the movement of the cell is tried with respect to the lattice (i,j+1) and to the lattice (i+1,j−1).

Each lattice used in the above-described processing is set to have a size large enough to accommodate a macrocell having the maximum size. In addition, this lattice size need not be set to be always constant, but may be reduced upon convergence of the processing.

In the above-described method, however, the cut number may be greatly increased upon movement of a cell. Hence, this method is not satisfactorily effective in terms of facilitation of wiring. In addition, since evaluation and improving processing are always performed for all the lattices on a chip, updating and the like of internal data require a considerable period of time, and the processing time may be prolonged.

In this embodiment, therefore, the following method is employed to minimize the total cut number and efficiently decrease locally high wiring density levels.

Figure 7:
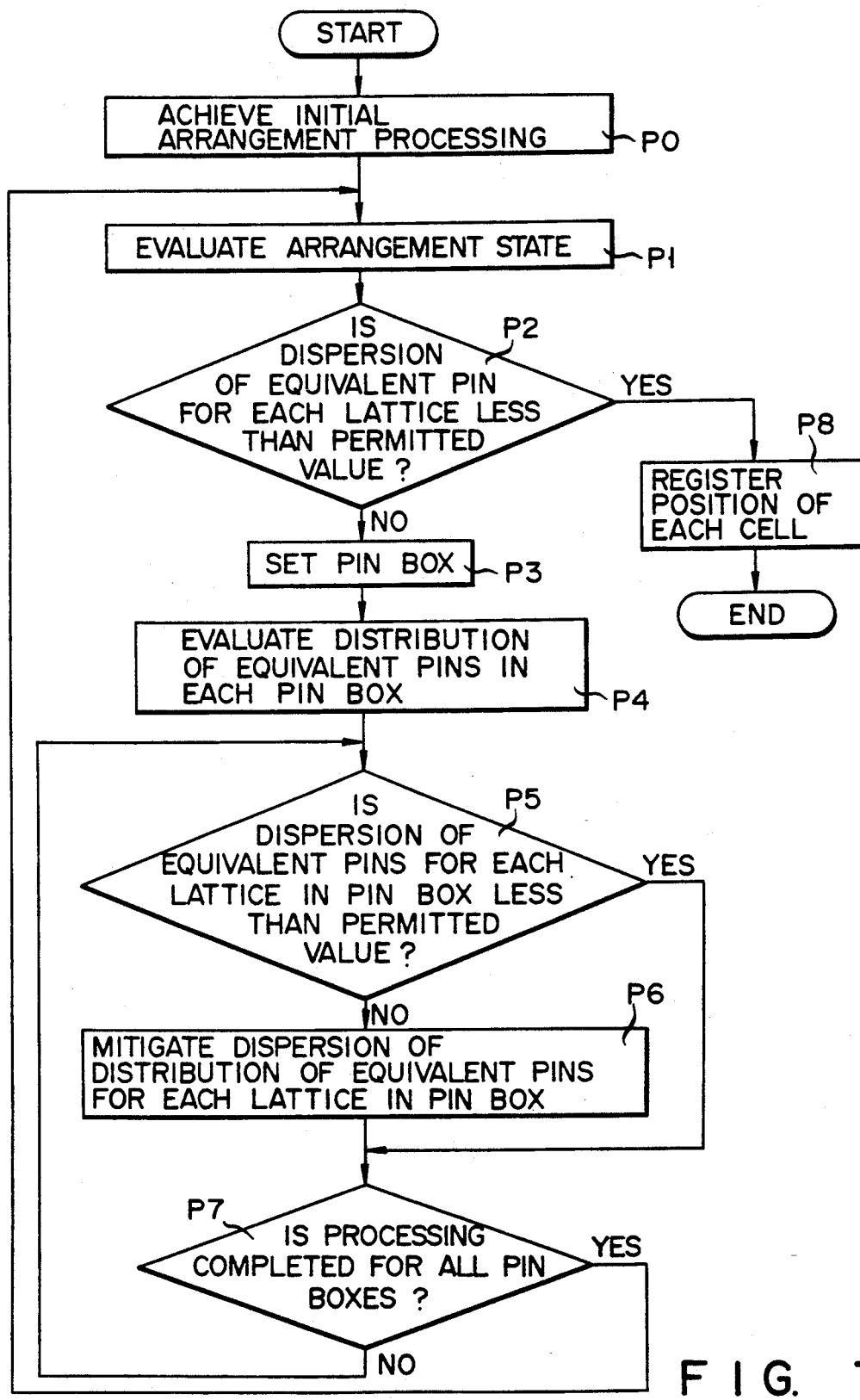
FIG. 7 is a flow chart showing a procedure of a arrangement method for logic cells according to the second embodiment of the present invention.

An arrangement method for logic cells in a semiconductor IC device according to the second embodiment of the present invention will be described below with reference to FIG. 7. After the processing is started, all the cells and wirings are developed into connection pins and inhibited areas for wiring, the chip is divided into lattices, and the distribution state of equivalent pins of a region capable of arrangement for each lattice is obtained (steps P0 and P1). The series of operations described above are performed in the same manner as in the first embodiment in FIG. 3.

In this case, if the dispersion of the equivalent pins for each lattice is less than a permitted value, the processing is completed (steps P2 and P8). Otherwise, the subsequent improving processing is performed.

In the second embodiment, the chip which is divided into lattices by horizontal and vertical lattice sides 31 and 32 is further divided into pin boxes (box regions) as large-size lattices each consisting of a plurality of lattices. Arrangement processing is performed for each pin box. The size of a pin box may be set to be, e.g., about $2 \times 2$ to $5 \times 5$ in terms of the number of lattices (step P3). FIG. 8 shows a case wherein a chip is divided into pin boxes 34 each having a size of $2 \times 2$ (the number of lattices 33) with the lower left point of the chip being set as a reference point. The number of pin boxes 34 set on the chip is 16.

After the distribution state of equivalent pins in each pin box is evaluated (step P4), a cell is moved within a pin box in which the distribution state of the equivalent pins exceeds a permitted value, thus mitigating the dispersion of the distribution of the equivalent pins for each lattice in the pin box (steps P5 to P7). In this case, selection of a candidate cell to be moved and determination of a destination may be performed in the same manner as in the processing shown in FIG. 3 (step P6). After the equivalent pin distribution is improved for each pin box, the overall pin distribution state of the chip is evaluated. If it is determined that further improving processing is required, the processing from step P5 to step P7 is repeated. However, since no cell is moved across pin boxes, in order to uniform the overall distribution state, lattice members included in a pin box must be changed by a certain technique.

FIG. 9 shows a case wherein pin boxes 34 which are different in setting from the initial pin boxes are realized on a chip by moving the positions of the pin boxes 34 in units of lattices 33. FIG. 9 shows a technique of randomly changing the setting of the pin boxes 34 so as to cause any one of the lattice points of a macrolattice constituting a pin box 34 to coincide with any one of the lattice points (denoted by reference symbols a to i in FIG. 9) included in the pin box 34 when the pin box 34 is placed at the lower left point of the chip. In FIG. 9, one of the lattice points of the macrolattice coincides with the lattice point e. In this case, the pin boxes 34 must be set to cover the entire chip region. By changing the setting of the pin boxes 34 in this manner, the movement of a cell across the lattices 33, which cannot be performed in the initial setting of the pin boxes, can be performed.

Subsequently, the dispersion of the equivalent pins in each pin box is reduced while the setting of the pin boxes 34 is updated, thus uniforming the equivalent pin distributions of the entire chip. The processing from step P1 to step P7 is repeated until the dispersion of the equivalent pins for each lattice becomes less than the permitted value.

In this case, since the movement of a cell is limited by a pin box size, the cut number is not greatly increased by this processing. In addition, since only several tens of lattices are included in each pin box at most, selection of candidate cells to be moved and determination of their destinations can be performed at high speed. The processing time for one pin box depends on only the number of lattices in the pin box. The overall processing time is increased in proportion to the number of pin boxes to be set.

According to the second embodiment, since the sums of the numbers of connection pins and equivalent pins with respect to regions capable of arrangement can be uniformed on a chip, an increase in local wiring density can be prevented, and the wiring rate can be greatly increased. In addition, since the distributions of connection pins and equivalent pins are uniformed in units of pin boxes, locally high wiring density levels can be lowered while an increase in cut number is minimized. Moreover, since the amount of data to be processed at once is limited by the number of lattices in a box region, the processing speed can be further increased.

The present invention is not limited to the second embodiment. For example, the size of a pin box is not limited to $2 \times 2$ but may properly be changed in accordance with specifications. In addition, in order to obtain a uniform equivalent pin distribution of the entire chip, the size of a pin box may be changed instead of moving pin boxes. Moreover, a more uniform equivalent pin distribution can be obtained by moving pin boxes and changing the pin box size at the same time. Various other changes and modifications can be made within the spirit and scope of the invention.

The third embodiment which is designed to decrease locally high wiring density level and increase the wiring rate will be described below.

The third embodiment is associated with arrangement processing for reduction in cut number. An arrangement method in which a two-dimensional aspect, i.e., both the X and Y directions are considered will be described below.

More specifically, in the third embodiment, cutlines are set in the X and Y directions for the entire layout region in advance so as to define lattices. A lattice is then selected on the basis of a predetermined evaluation function. A cell candidate to be moved is selected from the selected lattice on the basis of another evaluation function. The selected lattice is then divided into three regions in the X and Y directions by two pairs of cutlines in the X and Y directions which define the selected lattice, and the number of pins to be connected to the candidate cell to be moved is counted. By using the obtained number of pins, the moving direction of the pin in which the number of wirings extending across the total of four cutlines defining the target lattice is minimized is calculated. The cell is moved to an adjacent lattice in the calculated direction. The above-described processing is repeatedly performed for all the cell candidates to be moved in the layout region.

According to the third embodiment, since both the X and Y directions are considered, local wiring density dispersion can be prevented, and the cells in the entire layer region can always be moved in the direction in which the cut number is minimized. In addition, according to the third embodiment, an arrangement result is not influenced by the processing order of cutlines, unlike the Min-Cut method.

Figure 10:
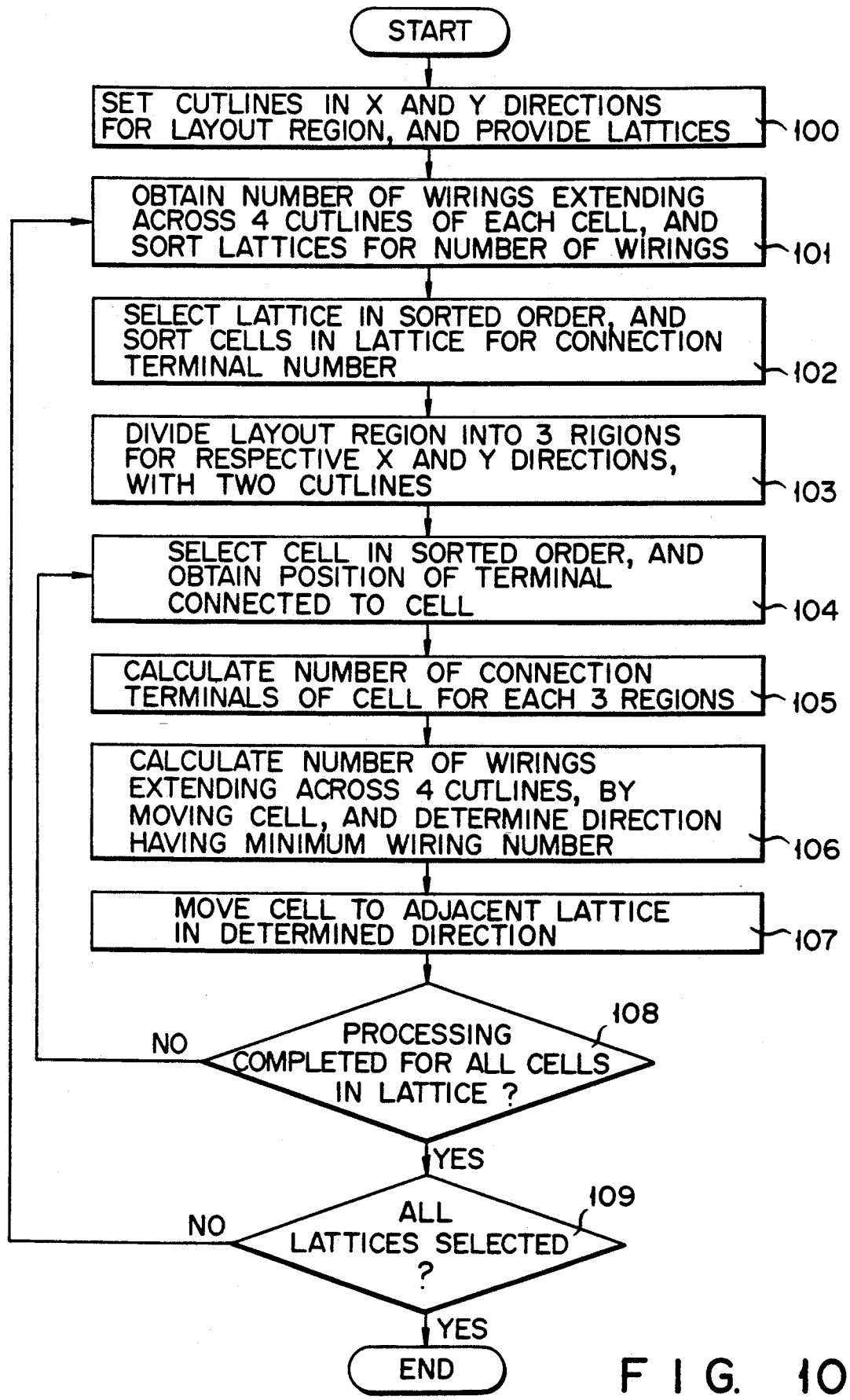
FIG. 10 is a flow chart showing a procedure of an arrangement method according to the third embodiment of the present invention.
Figure 11:
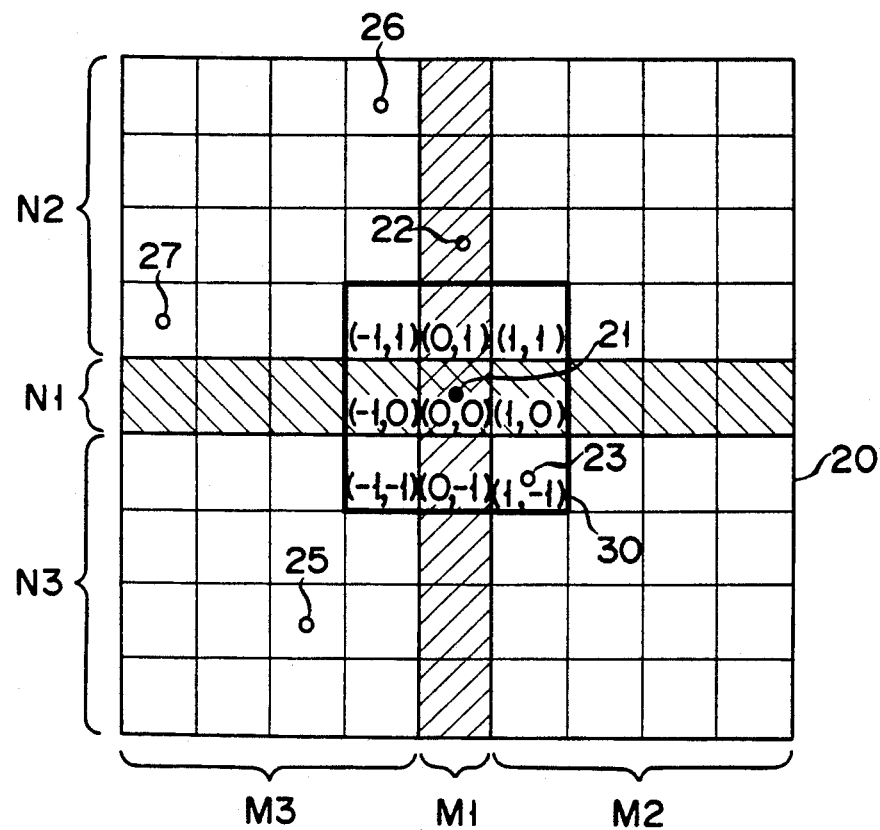
FIG. 11 is a view for explaining a method of determining the positions to which cells are moved according to the third embodiment.

The third embodiment will be described in detail below with reference to FIGS. 10 and 11.

Cutlines are set in the X and Y directions for an entire layout region 20 (step 100). A rectangle defined by two cutlines each in the X and Y directions is called a lattice. Lattices are then sorted on the basis of the sum of wirings extending across four cutlines defining each lattice (step 101). A target lattice is selected in the sorted order, and candidate cells in the selected lattice are selected in the order of increasing the number of connection pins (step 102). Referring to FIG. 11, reference numeral 21 denotes a corresponding cell. Thereafter, the layout region 20 is divided into three regions in the X and Y directions, i.e., regions respectively denoted by reference symbols M1, M2, M3, N1, N2, and N3 by using two cutlines each in the X and Y directions which define the selected lattice (step 103). In this case, the regions M1 and N1 include the selected lattice. Subsequently, the positions of pins 22 to 26 having connecting relationships with the candidate cell 21 are obtained (step 104). The number of connection pins which belong to each divided region is obtained (step 105). In FIG. 11, M1=1 (the number of connection pins), M2=1, M3=3, N1=0, N2=2, and N3=3. When all the connection pins of the candidate cell 21 are counted, the moving direction of the cell in which the number of wirings extending across the total of four cutlines defining the target lattice is minimized is calculated (step 106). A method of calculating the direction will be described below with reference to FIG. 11.

Assume that if $M2-(M1+M3) \geq 0$, $X=1$, and that if $M3-(M1+M2) \geq 0$, $X=-1$. Otherwise, $X=0$. If values in the Y direction are obtained in the same manner as those in the X direction, coordinates (X,Y) can express nine directions. In FIG. 11, $X=-1$, and $Y=1$ is obtained by a similar calculation in the Y direction. The cell is moved to an adjacent lattice which is located within a region 30 and in a direction indicated by $(X,Y)=(-1,1)$ (step 107). Subsequently, the next candidate cell is selected from the same lattice, and a cell moving operation is performed in the same manner as described above (step 108). If all the cells are selected from the lattice, the next lattice is selected and candidate cells are selected therefrom (step 109). The above-described processing is repeated until moving operations for all the lattices are completed.

According to the third embodiment of the present invention, in the arrangement processing for a semiconductor IC of a gate array system, locally high wiring density levels can be lowered, and hence the wiring rate of a large-scale logic IC chip can be increased.

Figure 12:
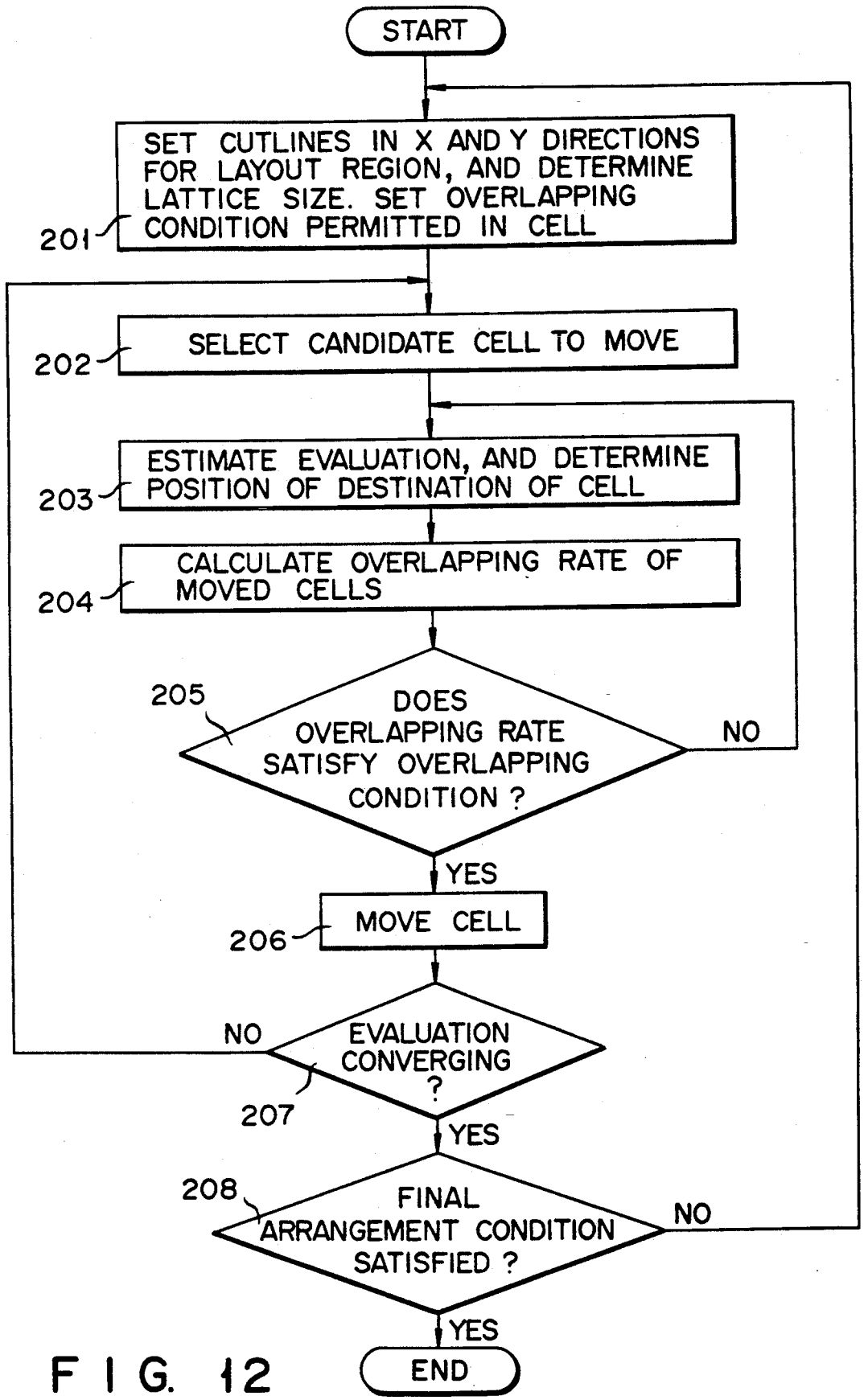
FIG. 12 is a flow chart showing a procedure of an arrangement method according to the fourth embodiment of the present invention.

A layout method for a semiconductor IC according to the fourth embodiment of the present invention will be described below with reference to FIG. 12. In the fourth embodiment, the lattice size and the permitted overlapping rate of cells are gradually decreased with the progress of processing.

As shown in FIG. 13A, cutlines are set in the X and Y directions for an entire layout region 41, and a lattice size is determined. In addition, an overlapping condition permitted in a logic cell is set (step 201). In this case, a relatively large lattice 42 is initially set, and at the same time, the overlapping condition as a limitation is set to be less strict than an actual condition. Subsequently, a candidate logic cell 43 to be moved or to be interchanged with another cell is selected (step 202). An objective function of improving processing is calculated for this logic cell, and the destination of the cell is determined with a lattice being regarded as a unit region to which each logic cell is moved (step 203). Referring to FIG. 13A, reference numeral 44 denotes a lattice as the determined destination.

The overlapping rate of the moved cells in the lattice 44 as the determined destination is calculated (step 204). Referring to FIG. 13B, reference numeral 45 denotes a permitted overlapping portion of the cells. It is checked whether the calculated overlapping rate of the cells satisfies the predetermined overlapping condition (step 205). If NO in step 205, another destination candidate lattice is selected (step 203). If YES in step 205, the logic cell is moved to the destination lattice (step 206). That is, the destination of the candidate cell is determined within the lattice in such a manner that the overlapping rate does not exceed the overlapping condition and the candidate cell is located at a position allowing arrangement. If the overlapping condition is not satisfied at any position allowing arrangement in the lattice, it is determined that the cell cannot be moved or interchanged with another cell, and the cell is not moved or interchanged with another cell.

Subsequently, a certain end condition is checked in relation to the currently-set lattice size and permitted overlapping condition of the cells, e.g., convergence of the end condition is checked (or it is checked whether a predetermined number of cells are moved) (step 207). If the condition does not converge, another candidate cell to be moved is selected (step 202). In this case, convergence means that the cut number is minimized. If convergence is achieved, it is checked whether a final arrangement condition is satisfied (step 208). If NO in step 208, a smaller lattice size and a more strict permitted overlapping condition of the cells are set (step 201), and the same improving processing as described above is performed. Referring to FIGS. 14A and 14B, reference numerals 46 and 47 respectively denote a corresponding lattice size and a corresponding permitted overlapping rate of the cells.

As described above, the above described processing is repeated while the lattice size is gradually reduced with the progress of processing, and the permitted overlapping condition of the cells is gradually made more strict so as to finally satisfy an accurate arrangement condition.

The arrangement improving processing used in the fourth embodiment will be briefly described below. A layout region is divided into lattices, and a candidate cell to be moved is selected. The moving direction of the cell in which the number of signal lines (cut number) extending across four cutlines defining a lattice to which the selected cell belongs is minimized is determined. If a position allowing arrangement of the cell and a permitted overlapping rate of the cells satisfy the corresponding conditions, the cell is moved (in the fourth embodiment, an overlapping rate of cells corresponds to the ratio of an area allowing arrangement of a cell to an actual arrangement cell area). The above-described processing is repeated until convergence is achieved.

Figure 15A:
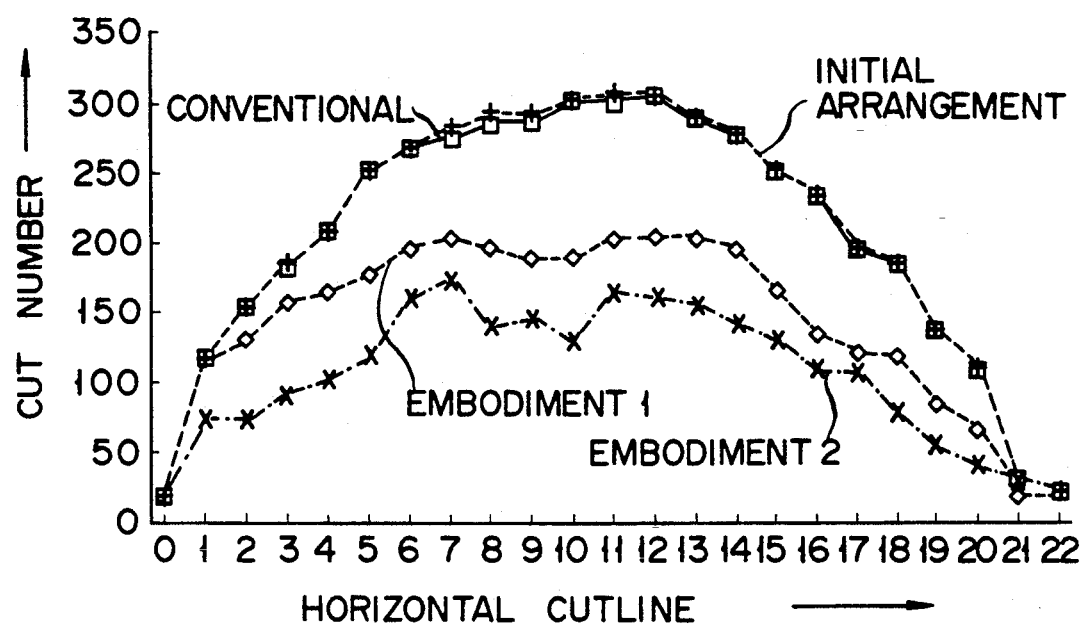
FIG. 15A is a graph showing cut numbers with respect to horizontal cutlines in the fourth embodiment and the conventional method.
Figure 15B:
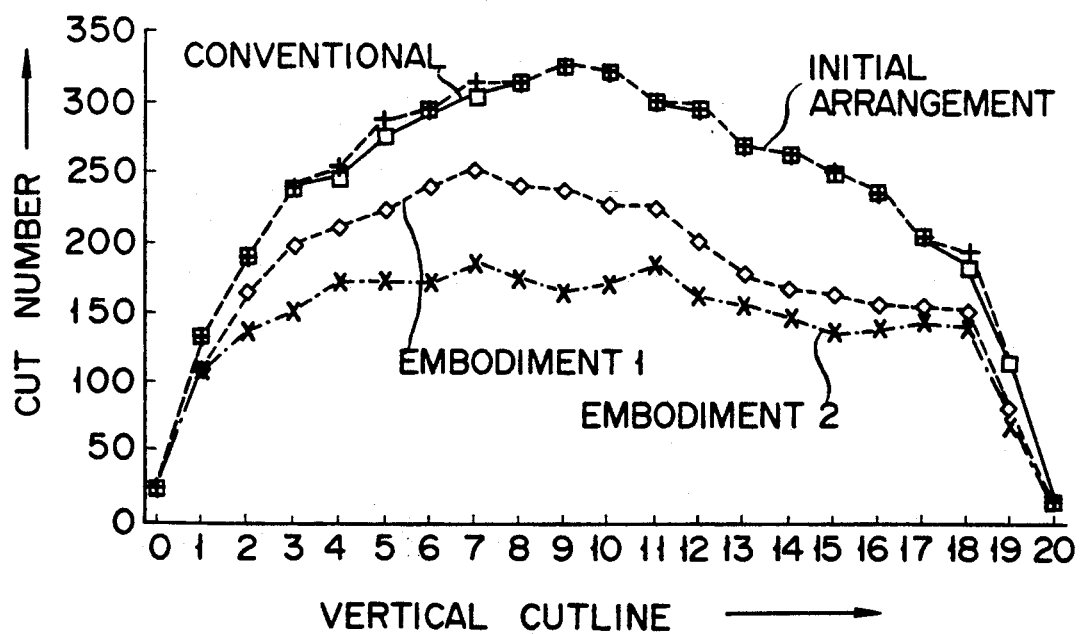
FIG. 15B is a graph showing cut numbers with respect to vertical cutlines in the fourth embodiment and the conventional method; an FIGS. 16A and 16B are a flow chart showing a procedure of an arrangement method according to the fifth embodiment of the present invention.

FIGS. 15A and 15B respectively show results obtained by the improving processing for reduction in cut number to which the conventional method and the method of the fourth embodiment of the present invention are applied. In FIGS. 15A and 15B, cut numbers (the number of times when wirings extend across cutlines) are plotted in units of cutlines, and symbols +, □, ◇, and x respectively represent an initial arrangement, a conventional method, an embodiment 1, and an embodiment 2. In this case, lattice sizes and permitted overlapping rates of cells in the conventional method and the fourth embodiment are set as shown in the following Table 1:

TABLE 1

|  | Conventional Method | Embodiment 1 | Embodiment 2 |
|---|---|---|---|
| Lattice size | (21, 23) | (5, 5) (8, 9) (11, 12) (21, 23) | (5, 5) (8, 9) (11, 12) (21, 23) |
| Permitted overlapping rate | 1.0 | 1.0 | 1.5 1.3 1.2 1.0 |

In the conventional method, both the lattice size and the permitted overlapping rate of cells are set to be constant. In Embodiment 1, the lattice size is gradually reduced while the permitted overlapping rate of cells is set to be constant. In Embodiment 2, the lattice size is gradually reduced, and the permitted overlapping rate is gradually made more strict. More specifically, in the conventional method, the lattice size is (21,23), i.e., 21 cutlines in the X direction and 23 cutlines in the Y direction. In Embodiment 1, the number of cutlines is sequentially increased as (5,5)→(8,9)→(11,12)→(21,23). In both the conventional method and Embodiment 1, the permitted overlapping rate of cells is set to be 1.0, i.e., no overlapping is permitted. In Embodiment 2, the permitted overlapping rate of cells is set be gradually decreased as 1.5→1.3→1.2→1.0, i.e., less strict at first but finally overlapping is prohibited. Note that these data were obtained from a base element of 5K with about 800 cells.

As is apparent from FIGS. 15A and 15B, the cut numbers in both the X (horizontal) and Y (vertical) directions are decreased in the order of the conventional method, Embodiment 1, and Embodiment 2. In addition, as shown in the following Table 2, in the conventional method, the total cut number is almost the same as that in the initial arrangement, whereas in Embodiment 1, the total cut number is greatly decreased. In Embodiment 2, the total cut number is further decreased as compared with Embodiment 1. That is, in the conventional method, a local solution appears. In contrast to this, Embodiments 1 and 2 to which the fourth embodiment is applied satisfy the object of improving processing, i.e., reduction in cut number.

TABLE 2

| Initial Arrangement | Conventional Method | Embodiment 1 | Embodiment 2 |
|---|---|---|---|
| 9699 | 9579 | 6977 | 5457 |

As described above, according to the fourth embodiment, by gradually decreasing the lattice size with the progress of arrangement improving processing, a local solution in the arrangement improving processing can be prevented, and the cut number can be reduced. If arrangement improving processing is started with a small lattice size, it takes a very long period of time to reach an optimal solution. However, in arrangement improving processing in which a lattice size is gradually reduced, even if there is a long distance to an optimal solution, a cell can quickly approach an optimal position while the lattice size is large. Thereafter, the cell can be placed at the optimal position when the lattice size is small. Therefore, the processing time with each lattice size can be greatly shortened, and the overall processing time can be shortened. In addition, if a permitted overlapping condition of cells is gradually made more strict, the prevention of a local solution and the shortening of a processing time can more effectively be realized. Therefore, the present invention is very effective for layout processing for logic cells.

The present invention is not limited to the above-described embodiments. For example, a lattice size and a permitted overlapping rate of cells need not be gradually decreased but may be temporarily increased. As described with reference to Embodiment 2, both the lattice size and the overlapping rate are preferably changed. However, as described with reference to Embodiment 1, even if only the lattice size is changed, a much better effect can be obtained as compared with the conventional method. Various changes and modifications can be made within the spirit and scope of the invention.

Figure 16A:
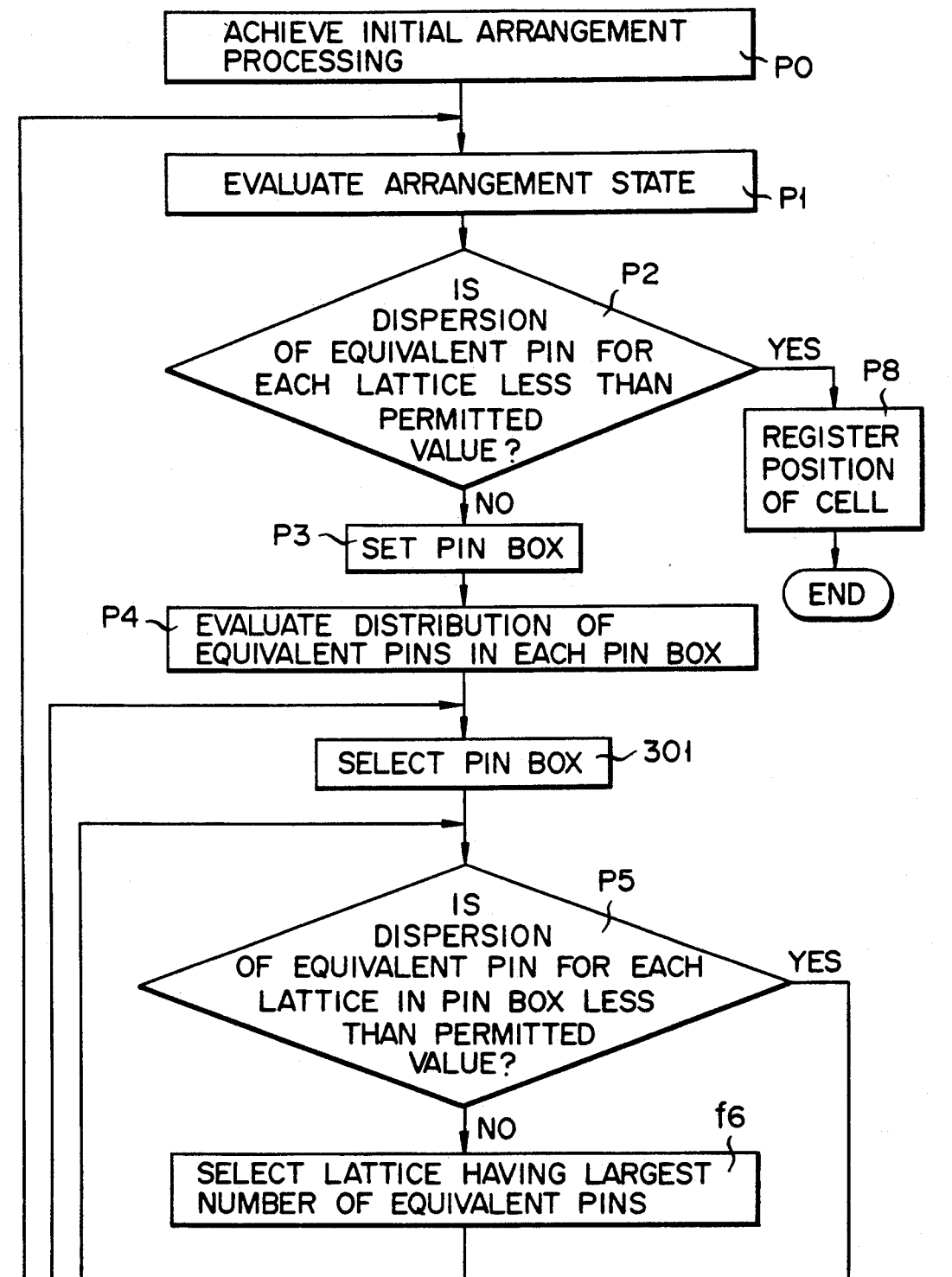
Figure 16B:
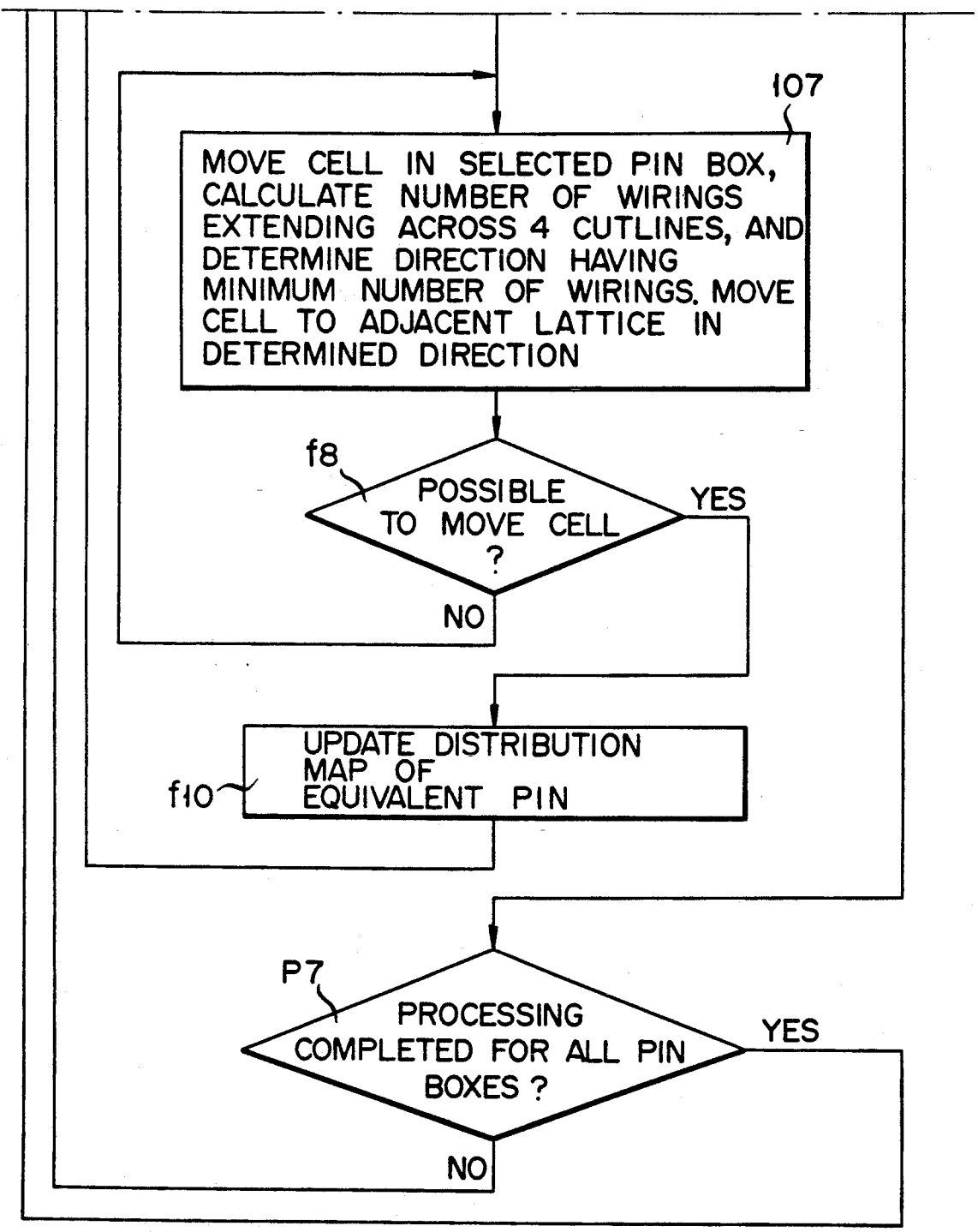

An arrangement method for logic cells in a semiconductor IC device according to the fifth embodiment of the present invention will be described below with reference to FIGS. 16A and 16B.

In this embodiment, arrangement processing for logic cells is performed by a method based on a combination of the first, second, and third embodiments. Therefore, the same step numbers in the fifth embodiment denote the same steps as in the first, second, and third embodiments. After the arrangement processing is started, all the cells and wirings are developed into connection pins and inhibited areas for wiring, the chip is divided into lattices, and the distribution state of equivalent pins of a region capable of arrangement for each lattice is obtained (steps P0 and P1).

If the dispersion of the equivalent pins of each lattice is less than a permitted value, the processing is completed at this moment (steps P2 and P8). Otherwise, the following arrangement improving processing is performed.

The chip, which is divided into lattices by horizontal and vertical lattice sides, is further divided into pin boxes (pin regions) as large-size lattices each consisting of a plurality of lattices, and processing is performed for each pin box. The size of each pin box may be set to be, e.g., 2×2 to 5×5 (the number of lattices) (step P3).

After the distribution state of equivalent pins is estimated for each pin box (step P4), one of the pin boxes is selected (step 301). It is checked whether the distribution state of the equivalent pins of the selected pin box exceeds a permitted value (step P5). If YES in step P5, cells are moved within the pin box. For this purpose, a lattice having the largest number of equivalent pins is selected (step f6).

When a cell is to be moved within the selected pin box, the direction in which the number of wirings extending across four cutlines is minimized is calculated, and the movement of the cell to an adjacent lattice is examined (steps 102 to 107). These steps are equivalent to steps 102 to 107 in the second embodiment. It is then checked whether the movement of the cell is possible (step f8). If not possible, the flow returns to step 107. If possible, the equivalent pin distribution map is updated (step f10), and the flow returns to step P5 to execute the processing. If the dispersion of the equivalent pins of each lattice in the pin box is less than the permitted value, it is checked whether the processing is performed for all the pin boxes (step P7). If NO in step P7, the flow returns to step 301. If YES in step P7, the flow returns to step P1. If the distribution of the equivalent pins of each lattice is less than the permitted value, the position of each cell is registered and the processing is completed (steps P2 and P8).

According to this embodiment, locally high wiring density levels can be efficiently decreased, and the wiring rate can be increased.

Additional advantages and modifications will readily occur to those skilled in the art. Therefore, the invention in its broader aspects is not limited to the specific details, representative methods, and illustrated examples shown and described. Accordingly, various modifications may be made without departing from the spirit or scope of the general inventive concept as defined by the appended claims and their equivalents.

What is claimed is:

1. An arrangement method for logic cells in a semiconductor IC device, in which a plurality of logic cells are arranged on a semiconductor chip and wiring is performed between the logic cells so as to realize a desired circuit, comprising the steps of:
   (a) expressing the logic cell informations to be arranged on the chip and already-arranged cell and wiring informations by means of connection pins and inhibited areas for wiring, respectively;
   (b) expressing the inhibited areas for wiring as the equivalent number of the connection pins so as to equivalently treat the inhibited areas for wiring as the connection pins;
   (c) imaginarily dividing the chip into lattices;
   (d) evaluating a distribution of a sum of the number of the connection pins and the equivalent number of the connection pins within each lattice, based on a ratio of the sum of the number of the connection pins and the equivalent number of the connection pins to an area capable of arrangement in such lattice;
   (e) extracting a desired lattice, if the ratio in at least one of said lattices falls outside a permitted value; and
   (f) exchanging the logic cells among the lattices; and
   (g) updating the distribution within said each lattice and repeating steps (e) to (f) until the ratio in said each lattice falls within the permitted value.

2. An arrangement method for logic cells in a semiconductor IC device, in which a plurality of logic cells are arranged on a semiconductor chip and wiring is performed between the logic cells so as to realize a desired circuit, comprising the steps of:
   (a) expressing cell informations to be arranged on a chip and already-arranged cell and wiring informations by means of connection pins and inhibited areas for wiring, respectively;
   (b) performing conversion processing to equivalently treat the inhibited areas for wiring and the connection pins, and expressing the inhibited areas for wiring as the equivalent number of the connection pins;
   (c) imaginarily dividing the chip into lattices;
   (d) designating a plurality of box regions each including a first predetermined number of lattices;
   (e) evaluating a distribution of a sum of the number of the connection pins and the equivalent number of the connection pins within each box region, based on a ratio of the sum of the number of the connection pins and the equivalent number of the connection pins to an area capable of arrangement in each lattice within each box region;
   (f) selecting a predetermined box region from said plurality of box regions;
   (g) extracting a desired lattice, if the ratio in at least one of said lattices falls outside a first permitted value within said predetermined box region;
   (h) exchanging the logic cells among the lattices within said predetermined box region;
   (i) updating the distribution within said each lattice and repeating steps (g) to (h) until the ratio in said each lattice falls within the first permitted value within said predetermined box region;
   (j) selecting another predetermined box region and repeating the steps (g) to (i) until the ratio falls within the first permitted value;
   (k) setting a plurality of another box regions each including a second predetermined number of lattices; and
   (l) repeating steps (e) to (j) until the ratio in said each lattice falls within a second permitted value within said predetermined box region.

3. An arrangement method for logic cells according to claim 2, wherein said plurality of another box regions in step (k) have a size different from that of said plurality of box regions in step (d).

4. An arrangement method for logic cells in a semiconductor IC device, in which an arrangement of a plurality of logic cells on a semiconductor chip and wiring between the logic cells is determined so as to realize a desired circuit, comprising the steps of:
   (a) expressing cell informations to be arranged on the chip and already-arranged cell and wiring informations by means of connection pins and inhibited areas for wiring, respectively;
   (b) performing conversion processing to equivalently treat the inhibited areas for wiring and the connection pins, and expressing the inhibited areas for wiring as the equivalent numbers of the connection pins;
   (c) imaginarily dividing the chip into lattices;
   (d) designating a plurality of box regions each including a predetermined number of lattices;
   (e) evaluating a distribution of a sum of the number of the connection pins and the equivalent number of the connection pins within each box region, based on a ratio of the sum of the number of the connection pins and the equivalent number of the connection pins to an area capable of arrangement in each lattice within each box region;
   (f) selecting a predetermined box region from said plurality of box regions;
   (g) extracting the lattice having the maximum equivalent number of the connection pins, it the ratio falls outside a first permitted value within said predetermined box region;
   (h) calculating a moving direction of the logic cell in which the number of wirings extending across cutlines of a lattice including the cell is minimized and moving the cell to an adjacent lattice which is located in the calculated direction;
   (i) updating the distribution and repeating steps (g) to (h) until the ratio of the sum of number of the connection pins and the equivalent number of the connection pins to the area capable of arrangement in each lattice falls within the first permitted value within said predetermined box region; and
   (j) selecting another box region and repeating the steps (g) to (i) until the ratio falls within a second permitted value.

* * * * *